United States Patent
Stoll et al.

(10) Patent No.: US 9,150,784 B1
(45) Date of Patent: Oct. 6, 2015

(54) LIGHTING MODULES, LIGHTING APPARATUS AND ELECTRONIC DEVICES

(71) Applicants: OSRAM Opto Semiconductors GmbH, Regensburg (DE); OSRAM GmbH, München (DE)

(72) Inventors: Ion Stoll, Obertraubling (DE); Stefan Lange, Augsburg (DE); Michael Schumann, Neu-Ulm (DE)

(73) Assignees: OSRAM Opto Semiconductors GmbH (DE); OSRAM GmbH (DE)

( * ) Notice: Subject to any disclaimer, the term of this patent is extended or adjusted under 35 U.S.C. 154(b) by 0 days.

(21) Appl. No.: 14/527,971

(22) Filed: Oct. 30, 2014

(51) Int. Cl.
| | |
|---|---|
| *H01J 1/62* | (2006.01) |
| *H01J 63/04* | (2006.01) |
| *C09K 11/08* | (2006.01) |
| *H05B 33/14* | (2006.01) |
| *H01L 33/50* | (2010.01) |
| *C09K 11/77* | (2006.01) |

(52) U.S. Cl.
CPC ......... *C09K 11/0883* (2013.01); *C09K 11/7734* (2013.01); *H01L 33/502* (2013.01); *H05B 33/14* (2013.01)

(58) Field of Classification Search
CPC ..... H01L 33/502; H01L 33/50; H01L 33/501; H01L 33/504; C09K 11/0883; C09K 11/7728; C09K 11/7774; C09K 11/7734; C09K 11/7701; C09K 11/7721
USPC ........ 313/498–512; 257/98–100; 362/84, 231
See application file for complete search history.

(56) References Cited

U.S. PATENT DOCUMENTS

| | | | |
|---|---|---|---|
| 2008/0149957 A1* | 6/2008 | Kameshima et al. | 257/98 |
| 2008/0185956 A1* | 8/2008 | Hiramatsu | 313/498 |
| 2008/0210958 A1* | 9/2008 | Senda et al. | 257/89 |
| 2009/0189514 A1* | 7/2009 | Hiramatsu et al. | 313/503 |
| 2010/0301739 A1* | 12/2010 | Nakamura et al. | 313/503 |
| 2012/0112626 A1* | 5/2012 | Sakuta et al. | 313/501 |
| 2012/0146079 A1* | 6/2012 | Baumann et al. | 257/98 |
| 2013/0009541 A1* | 1/2013 | Zheng et al. | 313/503 |

* cited by examiner

*Primary Examiner* — Thomas A Hollweg
*Assistant Examiner* — Kevin Quarterman
(74) *Attorney, Agent, or Firm* — DLA Piper LLP (US)

(57) ABSTRACT

A lighting module includes an optoelectronic semiconductor chip and a converter element for wavelength conversion. The optoelectronic semiconductor chip emits electromagnetic radiation including a dominant wavelength of 430 nm to 450 nm. The converter element includes a first phosphor and a second phosphor. The first phosphor is a garnet phosphor. The first phosphor emits electromagnetic radiation including a wavelength from the blue-green spectral range. The second phosphor is a nitrido-silicate phosphor. The second phosphor emits electromagnetic radiation including a wavelength from the orange-red spectral range.

20 Claims, 2 Drawing Sheets

LIGHTING MODULES, LIGHTING APPARATUS AND ELECTRONIC DEVICES

TECHNICAL FIELD

This disclosure relates to lighting modules, lighting apparatus and electronic devices.

BACKGROUND

It is known to provide flashlights with light-emitting diodes. Such flashlights are, for example, integrated into mobile phones. There is nonetheless a need for lighting modules, improved lighting apparatus and electronic devices.

SUMMARY

We provide a lighting module including an optoelectronic semiconductor chip and a converter element for wavelength conversion, wherein the optoelectronic semiconductor chip emits electromagnetic radiation including a dominant wavelength of 430 nm to 450 nm, the converter element includes a first phosphor and a second phosphor, the first phosphor is a $(Y,Lu,Gd,Ce)_3(Al,Ga)_5O_{12}$ garnet phosphor, the first phosphor emits electromagnetic radiation including a wavelength from the blue-green spectral range, the second phosphor is a $(Ca,Sr,Ba,Eu)_2Si_5N_8$ or $(Ca,Sr,Eu)AlSiN_3*Si_2N_2O$ nitride-silicate phosphor, and the second phosphor emits electromagnetic radiation including a wavelength from the orange-red spectral range.

We also provide a lighting apparatus including a lighting module including an optoelectronic semiconductor chip and a converter element for wavelength conversion, wherein the optoelectronic semiconductor chip emits electromagnetic radiation including a dominant wavelength of 430 nm to 450 nm, the converter element includes a first phosphor and a second phosphor, the first phosphor is a $(Y,Lu,Gd,Ce)_3(Al,Ga)_5O_{12}$ garnet phosphor, the first phosphor emits electromagnetic radiation including a wavelength from the blue-green spectral range, the second phosphor is a $(Ca,Sr,Ba,Eu)_2Si_5N_8$ or $(Ca,Sr,Eu)AlSiN_3*Si_2N_2O$ nitride-silicate phosphor, and the second phosphor emits electromagnetic radiation including a wavelength from the orange-red spectral range.

We further provide an electronic device including a lighting apparatus including a lighting module including an optoelectronic semiconductor chip and a converter element for wavelength conversion, wherein the optoelectronic semiconductor chip emits electromagnetic radiation including a dominant wavelength of 430 nm to 450 nm, the converter element includes a first phosphor and a second phosphor, the first phosphor is a $(Y,Lu,Gd,Ce)_3(Al,Ga)_5O_{12}$ garnet phosphor, the first phosphor emits electromagnetic radiation including a wavelength from the blue-green spectral range, the second phosphor is a $(Ca,Sr,Ba,Eu)_2Si_5N_8$ or $(Ca,Sr,Eu)AlSiN_3*Si_2N_2O$ nitride-silicate phosphor, and the second phosphor emits electromagnetic radiation including a wavelength from the orange-red spectral range.

We further provide a mobile phone including the electronic device including a lighting apparatus including a lighting module including an optoelectronic semiconductor chip and a converter element for wavelength conversion, wherein the optoelectronic semiconductor chip emits electromagnetic radiation including a dominant wavelength of 430 nm to 450 nm, the converter element includes a first phosphor and a second phosphor, the first phosphor is a $(Y,Lu,Gd,Ce)_3(Al,Ga)_5O_{12}$ garnet phosphor, the first phosphor emits electromagnetic radiation including a wavelength from the blue-green spectral range, the second phosphor is a $(Ca,Sr,Ba,Eu)_2Si_5N_8$ or $(Ca,Sr,Eu)AlSiN_3*Si_2N_2O$ nitride-silicate phosphor, and the second phosphor emits electromagnetic radiation including a wavelength from the orange-red spectral range.

Figure 1:
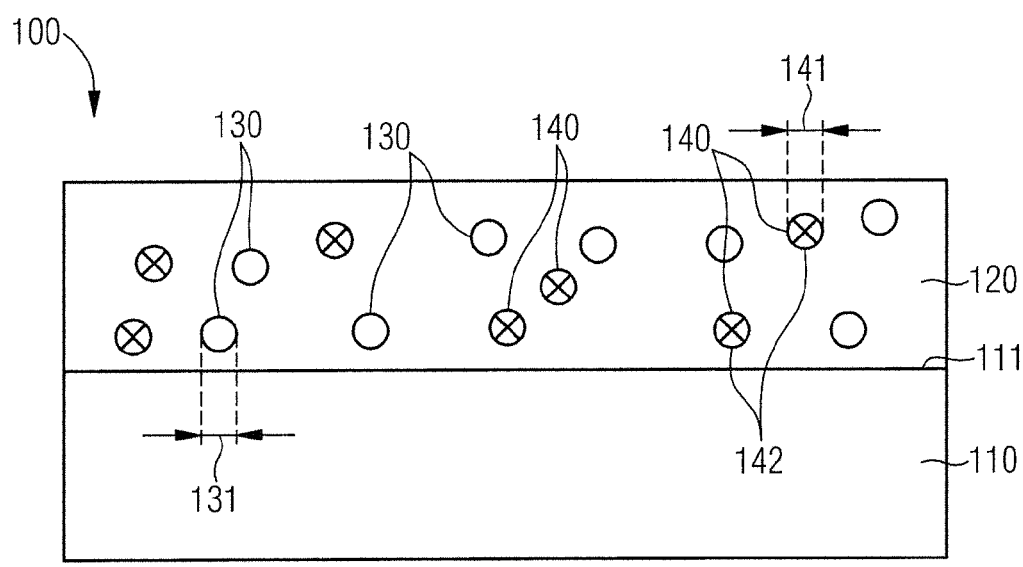
FIG. 1 shows a schematic view of a lighting module.

REFERENCE SYMBOLS 100 lighting module
110 optoelectronic semiconductor chip
111 emission face
120 converter element
130 first phosphor
131 first average size
140 second phosphor
141 second average size
142 coating
200 lighting apparatus
210 first lighting module
220 second lighting module
230 third lighting module
240 optical element
300 electronic device

DETAILED DESCRIPTION

It will be appreciated that the following description is intended to refer to specific examples of structure selected for illustration in the drawings and is not intended to define or limit the disclosure, other than in the appended claims.

Our lighting modules may comprise an optoelectronic semiconductor chip and a converter element for wavelength conversion. The optoelectronic semiconductor chip emits electromagnetic radiation comprising a dominant wavelength of 430 nm to 450 nm. The converter element may comprise a first phosphor and a second phosphor. The first phosphor may be a garnet phosphor of the system $(Y,Lu,Gd,Ce)_3(Al,Ga)_5O_{12}$. The first phosphor emits electromagnetic radiation comprising a wavelength from the blue-green spectral range. The second phosphor is a nitrido-silicate phosphor of the system $(Ca,Sr,Ba,Eu)_2Si_5N_8$ or of the system $(Ca,Sr,Eu)AlSiN_3*Si_2N_2O$. The second phosphor emits electromagnetic radiation comprising a wavelength from the orange-red spectral range.

Our lighting apparatus may comprise a first lighting module of the aforesaid kind.

Our electronic devices may comprise a lighting apparatus of the aforesaid kind.

For a clearer understanding of the above-described features, a more detailed description briefly summarized above may be had in the following in conjunction with representative examples, some of which are illustrated in the accompanying drawings. It is to be noted, however, that the accompanying drawings only show typical examples and are therefore not limiting in scope.

FIG. 1 shows a schematic sectional drawing of a lighting module 100. The lighting module 100 comprises an optoelectronic semiconductor chip 110 and a converter element 120.

The optoelectronic semiconductor chip 110 comprises an emission face 111. The optoelectronic semiconductor chip 110 emits electromagnetic radiation at its emission face 111. The optoelectronic semiconductor chip 110 may, for example, be a light-emitting diode (LED) chip. The optoelectronic semiconductor chip 110 may, for example, be designed to emit light with a dominant wavelength of 430 nm to 450 nm, preferably 440 nm to 450 nm.

The converter element 120 of the lighting module converts a fraction of the electromagnetic radiation emitted by the optoelectronic semiconductor chip 110 into electromagnetic radiation comprising other wavelengths. In the example depicted in FIG. 1, the converter element 120 is arranged directly on the emission face 111 of the optoelectronic semiconductor chip 110 in the optical path of the lighting module 100. Alternatively, the converter element 120 may be spaced apart from the optoelectronic semiconductor chip 110 in the optical path of electromagnetic radiation emitted by the optoelectronic semiconductor chip 110. It is also possible to embed the optoelectronic semiconductor chip 110 into the converter element 120 such that electromagnetic radiation emitted by the optoelectronic semiconductor chip 110 passes through the converter element 120.

The converter element 120 comprises a first phosphor 130 and a second phosphor 140. The first phosphor 130 and the second phosphor 140 may be embedded into a matrix material of the converter element 120. The matrix material may, for example, comprise a silicone.

The first phosphor 130 and the second phosphor 140 may, for example, be provided as particles. In this case, the converter element 120 comprises a first plurality of particles comprising the first phosphor 130 and a second plurality of particles comprising the second phosphor 140. The particles comprising the first phosphor 130 comprise a first average size 131. The particles comprising the second phosphor 140 comprise a second average size 141. The first average size 131 and the second average size 141 are preferably 5 µm to 30 µm, most preferably 7 µm to 17 µm.

The first phosphor 130 of the converter element 120 of the lighting module 100 is a garnet phosphor of the system $(Y,Lu,Gd,Ce)_3(Al,Ga)_5O_{12}$. The first phosphor 130 emits electromagnetic radiation comprising a wavelength from the blue-green spectral range.

Preferably, the first phosphor 130 comprises a maximum absorption at a wavelength of 425 nm to 450 nm, most preferably 430 nm to 440 nm.

It is preferred that the first phosphor 130 is a garnet phosphor of the system $(Lu,Ce)_3(Al,Ga)_5O_{12}$. In this case the fraction of Ce is preferably 0.5% to 5%, most preferably 0.5% to 2%. In this case, the fraction of Ga is preferably 0% to 50%, most preferably 15% to 30%.

The second phosphor 140 of the converter element 120 of the lighting module 100 is a nitrido-silicate phosphor of the system $(Ca,Sr,Ba,Eu)_2Si_5N_8$ or of the system $(Ca,Sr,Eu)AlSiN_3*Si_2N_2O$. The second phosphor 140 emits electromagnetic radiation comprising a wavelength from the orange-red spectral range.

The second phosphor 140 preferably comprises a peak emission wavelength of 600 nm to 620 nm, most preferably 605 nm to 615 nm.

When the second phosphor 140 is a nitrido-silicate phosphor of the system $(Ca,Sr,Ba,Eu)_2Si_5N_8$, the fraction of Eu is preferably 0.5% to 4%, most preferably 1% to 2.5%. In this case, the fraction of Ba is preferably 30% to 70%, most preferably 45% to 55%. In this case, the fraction of Ca is preferably 0% to 20%, most preferably 0% to 10%. In this case, the fraction of Sr is chosen such that the sum of the alkaline earth metals and europium equals 100%.

When the second phosphor 140 is a nitrido-silicate phosphor of the system $(Ca,Sr,Eu)AlSiN_3*Si_2N_2O$, the fraction of Eu is preferably 0.1% to 2%, most preferably 0.3% to 1%. In this case, the fraction of Sr is preferably at least 60%, most preferably at least 80%. In this case, the fraction of Ca is chosen such that the sum of the alkaline earth metals and europium equals 100%.

When the second phosphor is a nitrido-silicate phosphor of the system $(Ca,Sr,Eu)AlSiN_3*Si_2N_2O$, the second phosphor 140 is preferably provided as particles comprising a coating 142 in the converter element 120 of the lighting module. The coating 142 may, for example, comprise $SiO_2$ or $Al_2O_3$ or another inert material. The coating may stabilize the particles of the second phosphor 140 against a degradation caused by humidity.

The converter element 120 of the lighting module 100 converts a part of the electromagnetic radiation emitted by the optoelectronic semiconductor chip 110 of the lighting module 100 into electromagnetic radiation of other wavelengths. A mixture of converted and unconverted electromagnetic radiation is emitted by the lighting module 100. The first phosphor 130 and the second phosphor 140 of the converter element 120 are chosen such that the electromagnetic radiation emitted by the lighting module 100 comprises a fraction of radiation in the blue-green spectral range. Preferably, the electromagnetic radiation emitted by the lighting module 100 comprises a ratio between a minimum intensity in the spectral range of 450 nm to 500 nm and a maximum intensity of the entire spectrum which is higher than 10%, more preferably higher than 12.5%, most preferably higher than 15%.

Additionally, the second phosphor 140 of the converter element 120 of the lighting module 100 is chosen such that a portion of the electromagnetic radiation emitted by the lighting module 100 in the spectral range above 650 nm is as low as possible.

Figure 2:
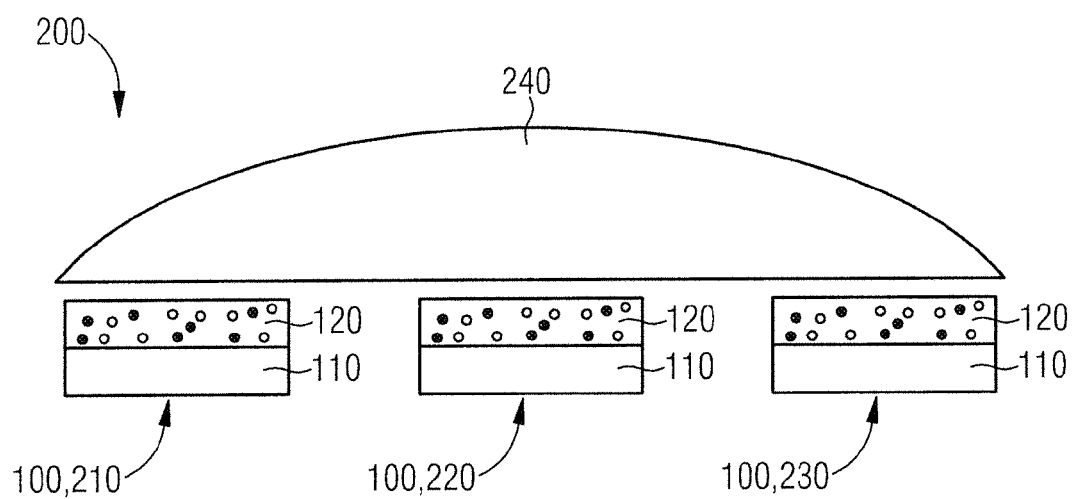
FIG. 2 shows a schematic view of a lighting apparatus.

FIG. 2 shows a schematic sectional drawing of a lighting apparatus 200. The lighting apparatus 200 comprises a first lighting module 210, a second lighting module 220 and a third lighting module 230. The first lighting module 210, the second lighting module 220 and the third lighting module 203 are designed as the lighting module 100 described with reference to FIG. 1 above. The first lighting module 210, the second lighting module 220 and the third lighting module 230 of the lighting apparatus 200 need not be identical to each other. It is possible to omit the third lighting module 230 and, optionally, also the second lighting module 220 of the lighting apparatus 200 such that the lighting apparatus 200 comprises only the first lighting module 210 or only the first lighting module 210 and the second lighting module 220.

The first lighting module 210, the second lighting module 220 and the third lighting module 230 of the lighting apparatus 200 each emits electromagnetic radiation, preferably visible light. The lighting apparatus 200 comprises an optical element 240 to mix the electromagnetic radiation emitted by the lighting modules 210, 220, 230. The optical element 240 may, for example, be an optical lens. The optical element 240 is arranged in the optical path of each lighting module 210, 220, 230 of the lighting apparatus 200. The optical element 240 may be omitted.

The first lighting module 210 of the lighting apparatus 200 preferably emits electromagnetic radiation comprising color coordinates located between the coordinates (0.21; 0.247), (0.26; 0.24); (0.24; 0.32) and (0.28; 0.31). The second lighting module 220 of the lighting apparatus 200 preferably emits electromagnetic radiation comprising color coordinates located between the coordinates (0.45; 0.41), (0.46; 0.39); (0.58; 0.39) and (0.58; 0.42). The third lighting module 230 of the lighting apparatus 200 preferably emits electromagnetic radiation comprising color coordinates located between the coordinates (0.40; 0.44), (0.39; 0.51); (0.45; 0.52) and (0.47; 0.46). The color coordinates may, for example, be color coordinates (Cx; Cy) in a CIE color space, for example, in the CIE 1931 color space.

The optoelectronic semiconductor chip 110 of the first lighting module 210, the optoelectronic semiconductor chip 110 of the second lighting module 220 and the optoelectronic semiconductor chip 110 of the third lighting module 230 of the lighting apparatus 200 may be operated with different drive currents.

The lighting apparatus 200 preferably emits electromagnetic radiation comprising color coordinates located within a three-step MacAdam ellipse from a line of black-body radiation at a temperature of 6500 K to 2700 K, most preferably 5000 K to 3000 K.

Figure 3:
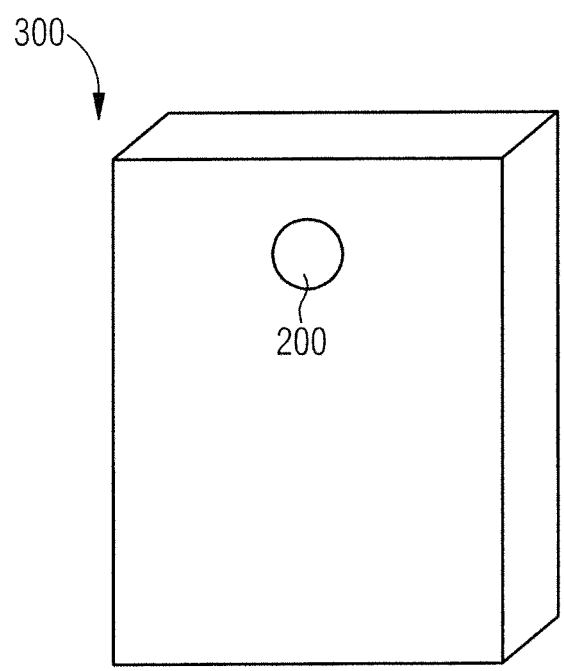
FIG. 3 shows a schematic view of an electronic device.

FIG. 3 shows a schematic view of an electronic device 300. The electronic device 300 may, for example, be a camera, for example, a photo camera or a video camera. The electronic device 300 may also be a mobile phone with an integrated camera.

The electronic device 300 comprises a lighting apparatus 200 as described with reference to FIG. 2 above. The lighting apparatus 200 may, for example, serve as a flashlight.

Our modules, apparatus and devices have been described and illustrated more specifically on the basis of the preferred examples. Nevertheless, this disclosure is not restricted to the examples disclosed. Rather, other variations can be derived therefrom by those skilled in the art, without departing from the scope of protection of the appended claims.

The invention claimed is:

1. A lighting module comprising:
an optoelectronic semiconductor chip and a converter element for wavelength conversion,
wherein the optoelectronic semiconductor chip emits electromagnetic radiation comprising a dominant wavelength of 430 nm to 450 nm,
the converter element comprises a first phosphor and a second phosphor,
the first phosphor is a $(Y,Lu,Gd,Ce)_3(Al,Ga)_5O_{12}$ garnet phosphor,
the first phosphor emits electromagnetic radiation comprising a wavelength from the blue-green spectral range,
the second phosphor is a $(Ca,Sr,Ba,Eu)_2Si_5N_8$ with an Eu fraction of 0.5 to 4% or $(Ca,Sr,Eu)AlSiN_3*Si_2N_2O$ with an Eu fraction of 0.1 to 2% nitride-silicate phosphor, and
the second phosphor emits electromagnetic radiation comprising a wavelength from the orange-red spectral range.

2. The lighting module according to claim 1, which emits electromagnetic radiation comprising a ratio between a minimum intensity in the spectral range of 450 nm to 500 nm and a maximum intensity of the entire spectrum which is higher than 10%.

3. The lighting module according to claim 1, wherein the optoelectronic semiconductor chip emits electromagnetic radiation comprising a dominant wavelength of 440 nm to 450 nm.

4. The lighting module according to claim 1, wherein the first phosphor comprises a maximum absorption at a wavelength of 425 nm to 450 nm.

5. The lighting module according to claim 1,
wherein the first phosphor is a $(Lu,Ce)_3(Al,Ga)_5O_{12}$ garnet phosphor,
the fraction of Ce is 0.5% to 5%, and
the fraction of Ga is 0% to 50%.

6. The lighting module according to claim 1, wherein the second phosphor comprises a peak emission wavelength of 600 nm to 620 nm.

7. The lighting module according to claim 1,
wherein the second phosphor is a $(Ca,Sr,Ba,Eu)_2Si_5N_8$ nitrido-silicate phosphor,
the fraction of Ba is 30% to 70%, and
the fraction of Ca is 0% to 20%.

8. The lighting module according to claim 1,
wherein the second phosphor is a $(Ca,Sr,Eu)AlSiN_3*Si_2N_2O$ nitride-silicate phosphor,
and
the fraction of Sr is at least 60%.

9. The lighting module according to claim 1, wherein the second phosphor is provided as particles comprising a coating.

10. The lighting module according to claim 9, wherein the coating comprises $SiO_2$ or $Al_2O_3$.

11. The lighting module according to claim 1, wherein the first phosphor and/or the second phosphor is provided as particles comprising an average size of 5 µm to 30 µm.

12. A lighting apparatus comprising a first lighting module according to claim 1.

13. The lighting apparatus according to claim 12, which emits electromagnetic radiation comprising color coordinates located within a 3-step MacAdam ellipse from a line of black-body radiation at a temperature of 6500 K to 2700 K.

14. A lighting apparatus comprising a first lighting module and a second lighting module, wherein the first lighting module and the second lighting module are according to claim 1.

15. The lighting apparatus according to claim 14,
wherein the first lighting module emits electromagnetic radiation comprising color coordinates located between coordinates (0.21; 0.247), (0.26; 0.24), (0.24; 0.32) and (0.28; 0.31) in a CIE 1931 color space, and
the second lighting module (100, 220) emits electromagnetic radiation comprising color coordinates located between coordinates (0.45; 0.41), (0.46, 0.39), (0.58; 0.39) and (0.58; 0.42) in a CIE 1931 color space.

16. A lighting apparatus comprising a first lighting module, a second lighting module, and a third lighting module, wherein the first lighting module, the second lighting module, and the third lighting module are according to claim 1.

17. The lighting apparatus according to claim 16, wherein the third lighting module emits electromagnetic radiation comprising color coordinates located between coordinates (0.40; 0.44), (0.39; 0.51), (0.45; 0.52) and (0.47; 0.46) in a CIE 1931 color space.

18. The lighting apparatus according to claim 14, further comprising an optical element that mixes the electromagnetic radiation emitted by the lighting modules.

19. An electronic device comprising a lighting apparatus according to claim 12.

20. A mobile phone comprising the electronic device according to claim 19.

* * * * *